United States Patent
Mathiprakasam et al.

(10) Patent No.: US 6,295,819 B1
(45) Date of Patent: Oct. 2, 2001

(54) THERMOELECTRIC HEAT PUMP FLUID CIRCUIT

(75) Inventors: Balakrishnan Mathiprakasam, Leawood; Patrick J. Heenan, Olathe, both of KS (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/484,143

(22) Filed: Jan. 18, 2000

(51) Int. Cl.⁷ ...................................................... F25B 21/02
(52) U.S. Cl. .................................................. 62/3.3; 62/3.5
(58) Field of Search .............................. 62/3.3, 3.5, 324.2

(56) References Cited

U.S. PATENT DOCUMENTS

| | | |
|---|---|---|
| 4,601,587 | 7/1986 | Mathiprakasam . |
| 4,634,803 | 1/1987 | Mathiprakasam . |
| 5,562,604 * | 10/1996 | Yablon et al. ............................ 62/3.3 |
| 5,711,155 * | 1/1998 | DeVilbiss et al. ........................ 62/3.3 |

* cited by examiner

Primary Examiner—William E. Tapolcal
Assistant Examiner—Mohammad M Ali
(74) Attorney, Agent, or Firm—Hovey, Williams, Timmons & Collins

(57) ABSTRACT

A thermoelectric heat pump fluid circuit apparatus (10) for alternately delivering hot and cold fluids to an end device (12) such as a therapeutic wrap or pad. The apparatus includes a heat pump (14), a fluid circuit (16) coupled with the heat pump and having a fluid contained therein, a pump (18) interposed in the fluid circuit for circulating the fluid therein, and a valve (20) interposed in the fluid circuit for selectively delivering fluid from the fluid circuit to a device coupled with the apparatus.

11 Claims, 1 Drawing Sheet

THERMOELECTRIC HEAT PUMP FLUID CIRCUIT

BACKGROUND OF THE INVENTION

1. Field of the Invention

The present invention relates to thermoelectric heating and cooling devices. More particularly, the invention relates to a thermoelectric heat pump fluid circuit for alternately delivering hot and cold fluids to a therapeutic heat pad, wrap, or other device.

2. Description of the Prior Art

Many devices and objects must be alternately heated and cooled during their use, manufacture, or maintenance. For example, in sports therapy, it is common to treat injured patients by alternately applying heat and cold to the injuries in a cyclic fashion via a heat pad or wrap. This procedure is commonly referred to as contrast therapy and is considered to be effective in reducing the healing time of an injury. To achieve the best therapeutic results with contrast therapy, it is beneficial to rapidly switch between application of heat and cold and to accurately control the temperature, time and other parameters relating to the treatment.

Prior art devices have been developed to alternately deliver hot and cold fluids to an end device for heating and cooling the end device. These prior art devices typically use thermoelectric heat pumps for heating and cooling the fluid delivered to the end device. Switching from heating to cooling (or vice versa) is accomplished by electrically reversing the polarity of power applied to the heat pump. This causes the hot side of the heat pump to become cold or the cold side to become hot to change the temperature of the fluid passing thereby before it is delivered to the end device. Unfortunately, the thermal mass of the heat pump slows the transition between heating and cooling modes after the polarity of the power has been reversed and therefore significantly limits the cycling speed of these prior art devices.

Electrically switching a heat pump between heating and cooling modes to alternately heat and cool an end device also wastes the heat present on the hot side of the heat pump when it is switched to a cooling mode and wastes the cool produced on the cold side of the heat pump when it is switched to a heating mode. This reduces the efficiency and therefore increases the operating costs of these prior art devices, especially when the devices must be frequently switched between heating and cooling modes as is done in contrast therapy.

OBJECTS AND SUMMARY OF THE INVENTION

The present invention solves the above-described problems and provides distinct advance in the art of thermoelectric heat pump devices used for contrast therapy and other applications. More particularly, the present invention provides a thermoelectric heat pump fluid circuit that can rapidly cycle between the delivery of hot and cold fluids to an end device such as a therapeutic wrap or pad and that significantly reduces the amount of thermal energy that is wasted during the operation thereof.

The apparatus of the present invention broadly includes a heat pump, a fluid circuit coupled with the heat pump and having a fluid contained therein, a pump interposed in the fluid circuit for circulating the fluid therein, and a valve interposed in the fluid circuit for selectively delivering fluid from the fluid circuit to an end device coupled with the apparatus such as a therapeutic pad or wrap. The heat pump has both a heating junction and a cooling junction. The fluid circuit includes a hot channel that passes by the heating junction of the heat pump and a cold channel that passes by the cooling junction of the heat pump. The valve is interposed in the fluid circuit between the hot channel and the cold channel and can be operated to selectively deliver either heated fluid or chilled fluid to the end device.

Alternating between the delivery of heated and chilled fluid to the end device does not require switching of the polarity of power delivered to the heat pump. Instead, the polarity of power delivered to the heat pump remains constant in the present invention so that the heating junction of the heat pump always stays hot and the cooling junction always stays cold. The apparatus of the present invention alternates between heating and cooling modes by mechanically changing the flow direction of the fluid in the fluid circuit. Specifically, when it is desired to heat the end device, the valve is operated to direct hot fluid that has just passed over the heating junction of the heat pump to the end device and to recirculate the returning fluid. Similarly, when it is desired to cool the end device, the valve is operated to deliver chilled fluid that has just passed over the cooling junction of the heat pump to the end device and to recirculate the returning fluid.

The apparatus of the present invention provides numerous advantages. For example, because the heating junction of the heat pump always stays hot and the cooling junction always stays cold, the thermal mass of the heat pump does not influence the transition between heating and cooling modes. Therefore, the apparatus of the present invention can rapidly cycle between heating and cooling modes. Moreover, the thermal energy produced by the heat pump is not wasted during cycling between heating and cooling modes of operation.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
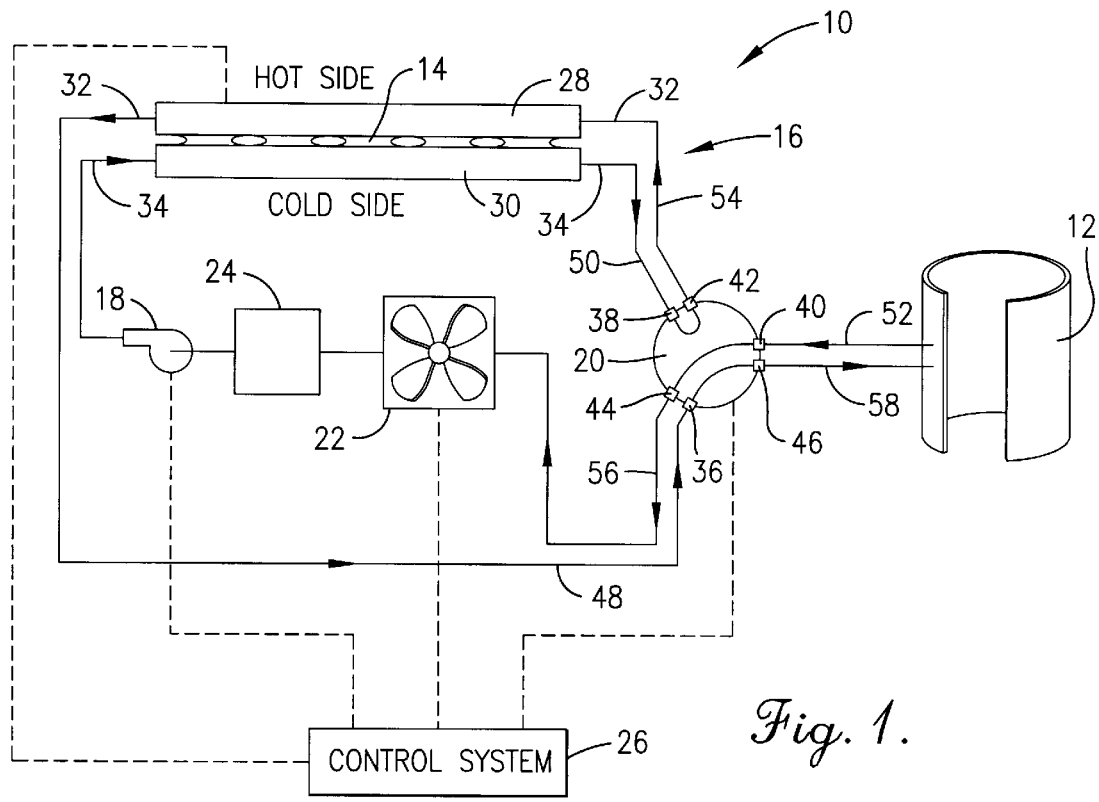
FIG. 1 is a schematic diagram of a thermoelectric heat pump fluid circuit constructed in accordance with a preferred embodiment of the present invention shown coupled with a therapeutic pad or wrap and illustrating a heating mode of operation.

Turning now to the drawing figures, a thermoelectric heat pump fluid circuit apparatus generally referred to by the numeral 10 and constructed in accordance with a preferred embodiment of the invention is illustrated. The apparatus is operable for alternately delivering heated and chilled fluids to an end device 12 such as a therapeutic pad or wrap and broadly includes a heat pump 14, a fluid circuit 16, a pump 18, a valve 20, a radiator and fan combination 22, a fluid reservoir 24, and a control system 26. The components of the apparatus are powered by appropriate source(s) of power.

In more detail, the heat pump 14 is preferably a thermoelectric heating and cooling device having a number of thermoelectric modules forming a heating junction 28 and a cooling junction 30. The thermoelectric heating and cooling device operates on the basis of a thermodynamic principle known as the Peltier effect. This phenomenon results in the generation of a temperature difference between junctions of two dissimilar materials when a direct current is passed through the materials. One junction is increased in temperature and this junction delivers heat to a fluid passed in thermal contact with it. The other junction is cooled and this absorbs heat from a fluid. Thus, a thermoelectric device can be operated as a heat pump and has the advantage of solid state components because of the absence of moving parts. An example of a thermoelectric module is a model number CP 1.4-127-10 device manufactured by MELCOR, Trenton, N.J.

The fluid circuit 16 is operably coupled with the heat pump 14 and is configured for holding and circulating a fluid therein. The fluid may be any gas or liquid, or combination thereof, that is commonly used in contrast therapy devices.

The fluid circuit 16 consists of enclosed fluid-carrying conduits and includes a hot channel 32 passing by the heating junction 28 of the heat pump 14 and a cold channel 34 passing by the cooling junction 30 of the heat pump. The flow directions of the fluids in the hot and cold channels may be parallel, across, or countercurrent to one another. However, best results are achieved using a countercurrent flow arrangement as illustrated. The cold and hot channels are preferably coupled with heat exchangers or fins for increasing heat transfer between the heat pump and the fluid circuit.

The pump 18 is interposed in the fluid circuit 16 and is operable for circulating the fluid therein. The pump is preferably positioned in front of the cold channel 34 of the fluid circuit so that it pumps fluid therethrough. The pump may be any conventional pump such as the model number ETS 15-V-C pump manufactured by GOTEC, Clinton, Mass.

The radiator and fan 22 are interposed in the fluid circuit 16 in series with the pump 18 and are operable to reject excess heat from the fluid circuit to ambient to maintain the heat balance of the fluid circuit at steady state operating conditions. This is necessary because heat rejected from the heating junction 28 of the heat pump 14 is greater than heat absorbed at the cooling junction 30 due to the heat generated by the electricity applied to the thermoelectric modules of the heat pump.

The reservoir 24 is also interposed in the fluid circuit 16 in series with the pump 18 and is provided for adding makeup fluid to the fluid circuit when required. The reservoir also keeps the fluid circuit free of air bubbles.

The valve 20 is interposed in the fluid circuit 16 between the hot and cold channels 32, 34 and is provided for selectively delivering either heated fluid or chilled fluid from the fluid circuit to the end device 12 coupled with the apparatus. The valve is preferably a six-way valve having three inlet ports 36, 38, 40 and three outlet ports 42, 44, 46. The inlet port 36 is connected to conduit 48 exiting the hot channel 32 of the fluid circuit, the inlet port 38 is connected to conduit 50 exiting the cold channel 34 of the fluid circuit, and the inlet port 40 is provided for coupling with conduit 52 that returns fluid after it has circulated through the end device 12. Similarly, the output port 42 is coupled with conduit 54 entering the hot channel of the fluid circuit, the outlet port 44 is coupled with conduit 56 entering the radiator, and the outlet port 46 is provided for coupling with conduit 58 that delivers heated or chilled fluid to the end device.

The valve 20 can be operated to deliver to the end device 12 either heated fluid from the hot channel 32 or chilled fluid from the cold channel 34. Specifically, to heat the end device as illustrated in FIG. 1, the valve connects the inlet port 36 to the outlet port 46 to direct heated fluid passing through the conduit 48 to the conduit 58 connected to the end device. The valve also connects the inlet port 40 to the outlet port 44 so that the heated fluid returning from the end device via conduit 52 passes back through the valve to the conduit 56 connected to the radiator 22. At the same time, the valve connects the inlet port 38 to the outlet port 42 to short-circuit the fluid exiting the cold channel 34 back to the entrance of the hot channel 32 so that the chilled fluid is not delivered to the end device.

Figure 2:
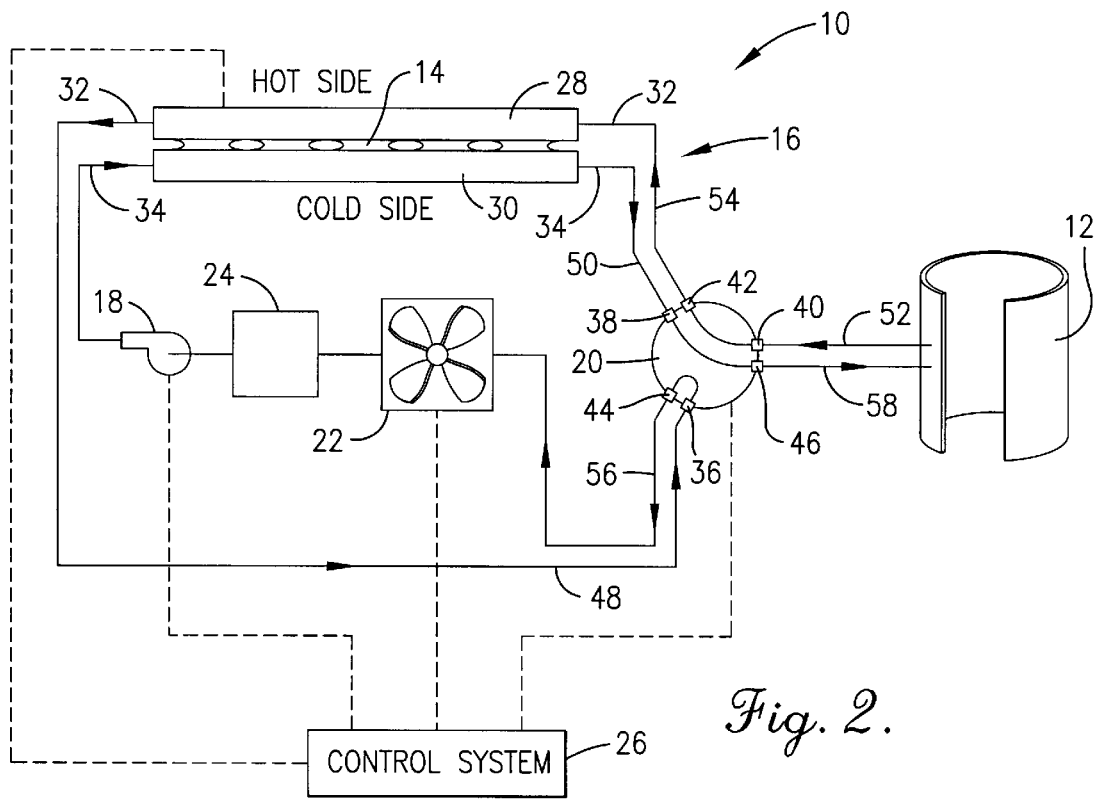
FIG. 2 is a schematic diagram of the apparatus showing a cooling mode of operation.

When it is desired to cool the end device 12 as illustrated in FIG. 2, the valve 20 connects the inlet port 38 to the outlet port 46 to deliver chilled fluid from the cold channel 34 to the conduit 58 entering the end device. The valve also connects the inlet port 40 to the outlet port 42 so that the chilled fluid returning from the end device via conduit 52 passes back through the valve to the conduit 54 connected to the entrance of the hot channel 32. At the same time, the valve connects the inlet port 36 to the outlet port 44 to short-circuit the hot fluid from the hot channel back to the conduit 56 entering the cold channel 34 so that hot fluid is not delivered to the end device.

The control system 26 controls operation of the heat pump 14, the pump 18, fan 22, and the valve 20 to provide the desired heating and cooling of the end device 12. The control system may consist of any conventional computing devices such as a controller and is coupled with the controlled components via conventional control wiring.

The control system 26 may be programmed to provide basic to complex control of the other components of the apparatus. For example, the control system may regulate the amount of electric power delivered to the thermoelectric heat pump 14 to achieve a desired fluid temperature in the hot and cold channels 32, 34 of the fluid circuit 16. The control system may also be programmed to control the speed of the fan 22 to regulate the amount of excess heat that is removed from the fluid circuit and convected to ambient. The control system may also control the speed of the pump 18 to regulate the fluid flow rate in the fluid circuit to control how quickly the device can be heated and cooled. Finally, the control system may be programmed to operate the valve 20 to automatically switch the apparatus between heating and cooling modes of operation according to a predefined schedule. For example, the control system may direct the valve to alternately deliver heated and chilled fluid to the end device so that the device is alternately heated for one minute and then chilled for four minutes.

Although the invention has been described with reference to the preferred embodiment illustrated in the attached drawing figures, it is noted that equivalents may be employed and substitutions made herein without departing from the scope of the invention as recited in the claims. For example, although the apparatus 10 of the present invention has been described and illustrated herein as being particularly useful for alternately delivering heated and chilled fluid to a therapeutic pad or wrap, it may also be used to deliver heated and chilled fluid to other types of devices. Also, although the apparatus of the present invention has been described as a thermoelectric heat pump, this apparatus could be a vapor compression heat pump or any other heat pump that can produce heating and cooling. Moreover, the particular size and rating of the various components of the apparatus may be selected to provide any volume and temperature of heated and chilled fluid at any flow rate.

Having thus described the preferred embodiment of the invention, what is claimed as new and desired to be protected by Letters Patent includes the following:

1. An apparatus for alternately delivering hot and cold fluids to a devise, the apparatus comprising:
   a heat pump having a heating junction and a cooling junction;
   a single fluid circuit for holding a fluid and including
      a hot channel passing by the heating junction of the heat pump for heating fluids in the hot channel, and
      a cold channel passing by the cooling junction of the heat pump for cooling fluids in the cold channel,
      wherein the hot channel and the cold channel are connected so that a single fluid passes by both the heating junction and the cooling junction of the heat pump;
   a pump interposed in the fluid circuit for circulating the fluid therein; and
   a valve interposed in the circuit between the hot channel and the cold channel for selectively and alternately delivering either heated fluid or cooled fluid to the devise without requiring switching of polarity of power delivered to the heat pump.

2. The apparatus as set forth in claim 1, further including a fan interposed in the fluid circuit for rejecting excess heat from the fluid circuit.

3. The apparatus as set forth in claim 1, further including a reservoir interposed in the fluid circuit for adding makeup fluid to the circuit.

4. The apparatus as set forth in claim 1, further including a controller coupled with the heat pump for controlling power applied to the heat pump to regulate temperature of the heating junction and the cooling junction.

5. The apparatus as set forth in claim 4, the controller also being coupled with the pump to regulate flow rate of the fluid in the fluid circuit.

6. The apparatus as set forth in claim 4, the controller also being coupled with the valve for controlling operation of the valve to alternately deliver the heated fluid and the cooled fluid to the device.

7. The apparatus as set forth in claim 4, the controller also being coupled with the fan for controlling speed of the fan.

8. The apparatus as set forth in claim 6, the controller being programmable to permit selective control of the heat pump and the valve.

9. The apparatus as set forth in claim 1, the heat pump comprising a thermoelectric heat pump.

10. The apparatus as set forth in claim 1, the device to which the apparatus delivers hot and cold fluids being a pad or wrap that can be placed on an injured or sore body part of a patient, the pad or wrap having a plurality of fluid channels therein for receiving and circulating the hot and cold fluids from the apparatus.

11. A method of alternately delivering hot and cold fluids to a device, the method comprising the steps of:
   providing a heat pump having a heating junction and a cooling junction;
   pumping a single fluid by both the heating junction and the cooling junction of the heat pump; and
   selectively and alternately delivering hot and cold fluids to the device without switching polarity of power delivered to the heat pump by mechanically switching flow of the fluid in the single fluid circuit to deliver to the device fluid that has just exited the heating junction or fluid that has just exited the cooling junction.

* * * * *